United States Patent [19]

Ashley-Rollman

[11] Patent Number: 4,506,230

[45] Date of Patent: Mar. 19, 1985

[54] ISOLATION CIRCUIT

[75] Inventor: Charles D. Ashley-Rollman, Andover, Mass.

[73] Assignee: Acrotechnology Corporation, Beverly, Mass.

[21] Appl. No.: 549,310

[22] Filed: Nov. 7, 1983

[51] Int. Cl.³ ............................................. H03F 3/38
[52] U.S. Cl. .................................................... 330/10
[58] Field of Search ................. 330/9, 10, 207 A, 250

[56] References Cited

U.S. PATENT DOCUMENTS

| | | | |
|---|---|---|---|
| 3,581,184 | 5/1971 | Hurd | 330/10 |
| 3,825,846 | 7/1974 | Grygers | 330/10 |
| 3,835,408 | 9/1974 | Shaffer | 330/10 |
| 3,854,091 | 12/1974 | Knudsen | 330/10 |
| 3,913,001 | 10/1975 | Kayama | 330/10 |
| 3,931,582 | 1/1976 | Kato et al. | 330/10 |
| 3,946,324 | 3/1976 | Smith | 330/10 |
| 3,988,690 | 10/1976 | Vance et al. | 330/10 |
| 4,000,473 | 12/1976 | Saito et al. | 330/10 |
| 4,066,974 | 1/1978 | Reinhard | 330/10 |
| 4,152,660 | 5/1979 | Olschewski | 330/10 |
| 4,191,929 | 3/1980 | Max et al. | 330/10 |
| 4,360,784 | 11/1982 | Bartlett | 330/10 |

Primary Examiner—James B. Mullins
Assistant Examiner—G. Wan
Attorney, Agent, or Firm—David W. Gomes

[57] ABSTRACT

An isolation circuit provides an isolation amplifier which receives an input signal and feeds a multiplexer switching circuit which is coupled to the primary winding of an isolation transformer. A pair of secondary windings are coupled to demultiplexer switching circuits for reconstructing the original input signal. One secondary winding is thereby used to produce an isolated output signal and the other is used to provide a feedback signal to the operational amplifier. The amplifier and switches are powered by isolated power supplies.

9 Claims, 1 Drawing Figure

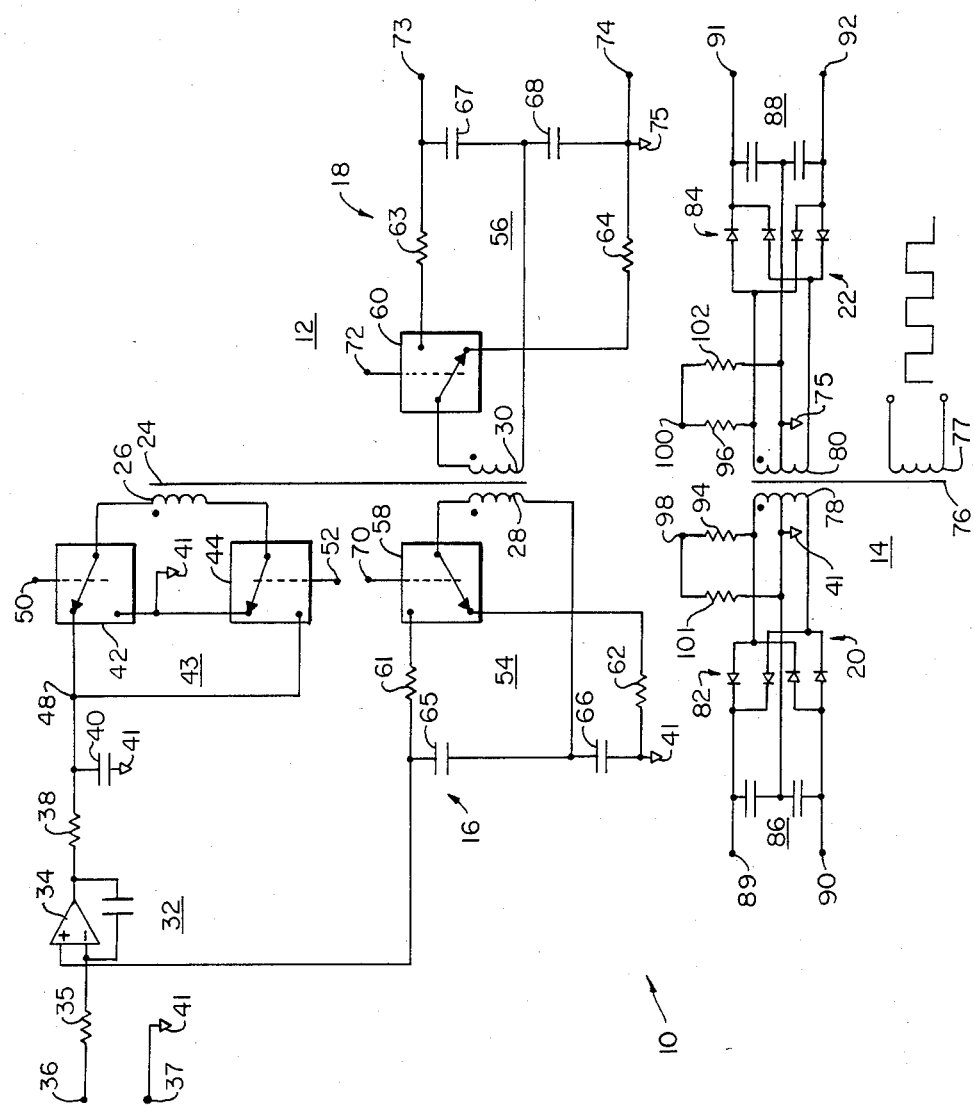

ISOLATION CIRCUIT

BACKGROUND OF THE INVENTION

1. Field of the Invention

The present invention generally relates to isolation circuits and, in particular, to such circuits which employ isolation transformers.

2. State of the Prior Art

Isolation circuits including isolation amplifiers and translation circuits are typically used in low-level signal processing to prevent the transmission of undesirable noise and other spurious signals. Many of the known designs for such amplifiers use transformers as a means of isolating input signals from output signals. Examples of such amplifiers and isolation circuits are taught by the U.S. Patents listed below.

| Inventor | U.S. Pat. No. |
|---|---|
| Hurd | 3,581,184 |
| Grygera | 3,825,846 |
| Shaffer | 3,835,408 |
| Knudsen | 3,854,091 |
| Kayama | 3,913,001 |
| Kata et al | 3,931,582 |
| Smith | 3,946,324 |
| Vance et al | 3,988,690 |
| Saito et al | 4,000,473 |
| Reinhard | 4,066,974 |
| Olschewski | 4,152,660 |
| Max et al | 4,191,929 |
| Bartlett | 4,360,784 |

The generally desirable characteristics of such isolation circuits include accuracy and stability of the circuit response and a high degree of common mode rejection.

SUMMARY OF THE INVENTION

Accordingly, an isolation circuit is provided which affords both high accuracy in reproduction of the analog signal and good common mode rejection. The isolation circuit comprises: input circuitry means including operational amplifier circuitry having an input means for receiving an input signal, a feedback input means and an output means; output circuitry means electrically isolated from the input circuitry means and including output terminal means; signal transformer means having a first primary winding and first and second secondary windings; power transformer means having a second primary winding and third and fourth secondary windings; power input means for providing a square wave input voltage to the second primary winding; rectifier-filter means coupled to the third secondary winding for supplying d.c. power to the input circuitry means isolated from said input circuitry means for supplying d.c. power to the output circuitry means first and second coupling means connected to the third and fourth secondary windings, respectively, for providing first and second switching means to the input and output circuitry means, respectively; the input circuitry means including first switching circuitry means for coupling the output means of the operational amplifier circuitry across the first primary winding and for periodically reversing the coupling thereacross in response to the first switching signal; and the input and output circuitry means including second and third switching circuitry means, respectively, connected to the first and second secondary windings, respectively for providing a signal to each of the feedback input means and the output terminal means, respectively, in response to the first and second switching signals, respectively.

BRIEF DESCRIPTION OF THE DRAWING

The present invention is illustratively described and shown in reference to the accompanying drawing which is a circuit diagram of one embodiment thereof.

THE DETAILED DESCRIPTION OF THE DRAWING

The FIGURE shows an isolation circuit 10 generally including a signal isolation section 12 and a power supply section 14. The signal isolation section 12 includes input circuitry means 16 and output circuitry means 18. The power isolation section 14 generally includes isolated power supply sections 20 and 22 for supplying power to the input and output circuitry means 16 and 18, respectively.

Input circuitry means 16 and output circuitry means 18 are isolated in the signal isolation section 12 by means of a transformer 24 which includes a primary winding 26 and secondary windings 28 and 30. The primary winding 26 is coupled to operational amplifier circuitry 32 having an operational amplifier 34. Operational amplifier circuitry 32 further includes input means having a resistor 35 and input signal terminals 36 and 37 coupled to the negative input of amplifier 34 and an input circuitry means ground 41, respectively. Output means are provided from the operational amplifier 34 via a resistor 38. A capacitor 40 is connected from resistor 38 to the ground 41 and acts as a high-frequency filter and decouples amplifier 34 from transients generated later on in the circuit. Feedback input means are provided by the positive input of amplifier 34. A capacitor 39 is connected from the output of amplifier 34 to its negative input for improving stability.

The output means of operational amplifier circuitry 32 is coupled to the primary winding 26 by means of switching circuitry means 43 including a pair of solid state, single-pole, double-throw switches 42 and 44. Each switch 42, 44 includes a common terminal connected to a separate end of primary winding 26 and a pair of switched terminals one of which is coupled to the input circuitry means ground 41 and the other of which is coupled to the output means of operational amplifier circuit 32 via a terminal 48. Switches 42 and 44 further include input terminals 50 and 52, respectively, for receiving a switching signal to provide for control of the respective switches.

The two secondary windings 28 and 30 are each coupled to a separate switching circuitry means 54 and 56, respectively. The switching circuitry means 54 and 56 each includes a single-pole, double-throw, solid state switch 58 and 60, respectively, which is similar to the switches 50 and 52. Each switch 58 and 60 includes a common terminal connected to one end of the respective secondary winding 28 and 30 and a pair of switched terminals. Each switched terminal of each switch 58 and 60 is connected to a series resistance-capacitance circuit made up of resistors 61 through 64 and respective capacitors 65 through 68. The resistance end of each respective series resistance-capacitance circuit is connected to the switched terminal of switches 58 and 60 and the capacitance end of each circuit is connected to the other end of the respective secondary winding. This later connection results in the two capacitors 65, 66 and 67, 68 being connected together at the other end of their respective secondary windings 28 and 30. Solid state switches 58 and 60 also include input terminals 70 and 72, respectively for receiving a switching signal for providing control of the respective switch.

By this arrangement, the switching circuits 54 and 56 are effective to reconstruct signals from the output means of operational amplifier circuitry 32 which signals have been chopped by the switching circuitry means 43 and transmitted through the isolation transformer 24. The output of each switching circuitry means 54 and 56 is provided across the capacitors 65, 66 and 67, 68. To provide for use of these signals the interconnection of resistor 61 and capacitor 65 is connected to the positive input of operational amplifier 34 while the interconnection of resistor 62 and capacitor 66 is connected to the input circuitry means ground 41. This connection is used for producing negative feedback at amplifier 34. The resulting isolated signal which is formed across capacitors 67 and 68 is connected to a pair of terminals 73 and 74 for output. Terminal 74 is connected to floating ground 75 for the output circuitry means 18.

The power isolation section 14 includes a power transformer 76 having an input primary winding 77 and a pair of matched secondary windings 78 and 80. Secondary windings 78 and 80 are coupled to power supply sections 20 and 22, respectively, which include rectifier-filter circuitry. A full-wave rectifier 82 and 84 is formed by four diodes for each of the secondary windings 78 and 80, respectively, and respective filters 86 and 88 are coupled thereto. The outputs of filter sections 86 and 88 are available on terminals 89 and 90 for the input circuitry means 16 and terminals 91 and 92 for the output circuitry means 18. The power supply sections are used to supply power to operational amplifier 34 and the switches 42, 44, 58, and 60. The interconnection of the capacitors comprising the filter sections 86 and 88, are coupled to a center tap of their respective secondary windings 78 and 80 and to the respective input and output circuitry means grounds 41 and 75. It is not necessary for the output circuitry means to receive d.c. power from the secondary winding 80. Any suitable d.c. power supply will suffice for the switch 60 so long as it is electrically isolated from the input circuitry means 16.

The power supply section 14 further includes coupling means in the form of resistors 94 and 96 each of which is connected to one end of a respective power secondary winding 78 and 80. Terminals 98 and 100 are respectively connected thereto. These coupling means provide switching signals for the input and output circuitry means for controlling the switches 42, 44, 58, and 60. For this purpose, terminal 98 is connected to terminals 50, 52, and 70 and terminal 100 is connected to terminal 72. Resistors 101 and 102 are respectively connected from terminals 98 and 100 to the center tap of their respective secondary windings 78 and 80 for the purpose of alternating the switching signals.

In general, standard available parts are used to construct the circuit 10. The operational amplifier 34 is an LM358 available from National Semiconductor. The double-pole, single-throw, solid state switches 42, 44, 58 and 60 are commonly referred to as analog multiplexers/demultiplexers and are available in a CMOS package generally designated 4053 from semiconductor suppliers such as RCA, National and Motorola. The package is a triple, two-channel one which includes three of the switches shown in the FIGURE. Because each switch in a package shares the same power supply, separate packages need to be used for the input and output circuitry means 16 and 18. Complete usage of each package may be obtained by constructing units having three input channels. A separate package is used for the input circuitry means 16 of each channel and a single package provides the switches 60 for the separate output circuitry means 18 of the three channels.

The transformers 24 and 76 are specially constructed for the application. Signal transformer 24 is wound with #40 copper wire on a pot core style core. The core measures eleven (11) millimeters by seven (7) millimeters and is made from material designated H5C2 which is available from TDK of Japan. The secondary windings 28 and 30 are symetrically wound about the primary winding 26 and all three are identical, each including 120 turns. The transformer 76 is constructed from the same style and size core, but from material designated 3B7 which is available from Ferroxcube of Saugerties, N.Y. The same wire is used and the primary winding 77 includes 100 turns. The secondary windings 78 and 80 are symmetrically wound about primary 77 and are identical, each including 120 turns. Any other suitable winding pattern for power transformer 76 may be used.

The isolation circuit 10 shown in the accompanying FIGURE operates in the following manner. A square wave power signal is provided to the primary winding 77 of power transformer 76. This causes the generation of identical square wave signals in the secondary windings 78 and 80 thereof. The square wave signals are rectified and filtered by their respective circuits and used to provide power to their respective input and output circuit means 16 and 18. By means of using the isolated secondaries 78 and 80, the respective power supplies are isolated from each other.

An analog signal, which is usually a d.c. signal with or without an a.c. component, is coupled to the terminals 36 and 37. This signal is fed to the negative input of amplifier 34 via resistor 35 and the input circuitry means ground 41. The output of amplifier 34 is filtered by capacitor 40 and chopped by the switches 42 and 44 into an alternating signal for transmission through transformer 24. The switches 42 and 44 perform the chopping in response to the switching signals from terminal 98. When switch 42 connects terminal 48 to one end of primary winding 26, switch 44 connects the other end of primary winding 26 to the input circuitry means ground. Then these conditions are reversed and the signal from terminal 48 is connected across primary winding 26 in the opposite direction. This and further reversals cause the transmission of the input signal through transformer 24.

The signal from terminal 48 is reconstructed from the secondary windings 28 and 30 via the switches 58 and 60 which are triggered by the switching signals from terminals 98 and 100, respectively. In response the switching signals, switch 58 reverses the polarity and connection of secondary winding 28 across capacitors 65 and 66. Likewise, switch 60 reverses the polarity and connection of secondary winding 30 across capacitors 67 and 68. Further, the switching signals which determine the chopping and reconstruction of the information signal to be transferred are syncronized by connection to symmetrical ends of secondary windings 78 and 80 to provide accurate reproduction of that information signal during the transfer. The switching circuits 54 and 56 reconstruct identical signals for transmission back to both the positive input of amplifier 34 as negative feedback and to the output terminals 73 and 74. The operational amplifier acts to adjust its output until the signals at its positive and negative inputs are identical. This means that the feedback signal to the positive terminal of amplifier 34 is identical to the signal from the input terminals 36 and 37, and that the output signal at 73, 74 is therefore identical to the input signal at 36, 37.

By these means, the signal inputted to terminals 36 and 37 is identically transferred to the output terminals 73 and 74 while eliminating the various interference signals which are mixed with the input signal. Due to the electrical isolation of the input and output circuitry means 16 and 18 along with the electrical isolation of their respective power supplies 20 and 22, the isolation circuit 10 exhibits excellent common mode rejection of the unwanted interference signals.

The above description of one embodiment of the present invention is intended to be taken in an illustrative and not a limiting sense. Various modifications and changes may be made in the described embodiment by persons skilled in the art without departing from the scope of the present invention as described in the appended claims.

What is claimed is:

1. An isolation circuit, comprising:
   input circuitry means including operational amplifier circuitry having an input means for receiving an input signal, a feedback input means and an output means;
   output circuitry means electrically isolated from said input circuitry means and including output terminal means;
   signal transformer means having a first primary winding and first and second secondary windings;
   power transformer means having a second primary winding and third and fourth secondary windings;
   power input means for providing a square wave input voltage to said second primary winding;
   rectifier-filter means coupled to said third secondary winding for supplying d.c. power to said input circuitry means;
   means isolated from said input circuitry means for supplying d.c. power to said output circuitry means;
   first and second coupling means connected to said third and fourth secondary windings, respectively, for providing first and second switching signals to said input and output circuitry means, respectively;
   said input circuitry means including first switching circuitry means for coupling said output means of said operational amplifier circuitry across said first primary winding and for periodically reversing said coupling thereacross in response to said first switching signal; and said input and output circuitry means including second and third switching circuitry means, respectively, connected to said first and second secondary windings, respectively, for providing a signal to each of said feedback input means and said output terminal means, respectively, in response to said first and second switching signals, respectively.

2. The circuit of claim 1, wherein said input circuit means includes an input circuit ground means and further wherein said first switching circuitry means includes a pair of single-pole, double-throw switch means each having a common terminal connected to a separate end of said first primary winding and a pair of switched terminals one of which is connected to said output means of said operational amplifier circuitry and the other of which is connected to said input circuit ground means.

3. The circuit of claim 2, wherein said second and third switching circuitry means each includes a single-pole, double-throw semiconductor switch having a common terminal connected to one end of said first and second secondary windings, respectively, and a pair of switched terminals each of which is connected to a separate series resistance-capacitance circuit with a resistor end thereof connected to said corresponding switched terminal and a capacitance end thereof connected to the other end of said first and second secondary windings, respectively.

4. The circuit of claim 3, wherein the signal provided for said feedback input means is determined across capacitance in said series resistance-capacitance circuits of said second switching circuit means and further wherein the signal provided for said output terminal means is determined across capacitance in said series resistance-capacitance circuits of said third switching circuit means.

5. The circuit of claim 4, wherein said feedback input means is connected for negative feedback in said operational amplifier circuitry.

6. The circuit of claim 5, wherein said second and third switching means are effective to reconstruct signals from said output means of said operational amplifier circuitry.

7. The circuit of claim 6, wherein said operational amplifier circuitry includes a signal return means connected to said input circuit ground means.

8. The circuit of claim 7, wherein said output circuit means includes an output circuit ground means which is electrically isolated from said input circuit means and said input circuit ground means.

9. The circuit of claim 8, wherein said means for supplying d.c. power to said output circuitry means includes rectifier-filter means coupled to said fourth secondary winding.

* * * * *